(12) United States Patent
Chang et al.

(10) Patent No.: US 12,745,479 B2
(45) Date of Patent: Sep. 22, 2026

(54) SENSING DEVICE AND FABRICATING METHOD OF THE SAME

(71) Applicant: AUO Corporation, Hsinchu (TW)

(72) Inventors: Chia-Ming Chang, Hsinchu (TW); Ruei-Pei Chen, Hsinchu (TW); Chia-Hsiu Tsai, Hsinchu (TW); Chun-Lin Chen, Hsinchu (TW)

(73) Assignee: AUO Corporation, Hsinchu (TW)

( * ) Notice: Subject to any disclaimer, the term of this patent is extended or adjusted under 35 U.S.C. 154(b) by 598 days.

(21) Appl. No.: 17/888,509

(22) Filed: Aug. 16, 2022

(65) Prior Publication Data

US 2023/0230996 A1 Jul. 20, 2023

Related U.S. Application Data

(60) Provisional application No. 63/300,734, filed on Jan. 19, 2022.

(51) Int. Cl.
*H10F 39/00* (2025.01)
*H10F 30/223* (2025.01)
(Continued)

(52) U.S. Cl.
CPC ......... *H10F 39/811* (2025.01); *H10F 30/223* (2025.01); *H10F 39/191* (2025.01); *H10F 77/169* (2025.01); *H10F 77/20* (2025.01)

(58) Field of Classification Search
None
See application file for complete search history.

(56) References Cited

U.S. PATENT DOCUMENTS 8,035,110 B2 * 10/2011 Kim ................... H10D 30/6713 257/E21.094
9,496,287 B2 * 11/2016 Kohara ............. G02F 1/136227
(Continued)

FOREIGN PATENT DOCUMENTS

CN 105097941 11/2015
CN 107359168 11/2017
(Continued)

OTHER PUBLICATIONS

Wang et al., Dual-gate photo thin-film transistor: a "smart" pixel for high-resolution and low-dose X-ray imaging, J. Phys.: Conf. Ser. 619 012023 (Year: 2015).*
(Continued)

*Primary Examiner* — Sue A Purvis
(74) *Attorney, Agent, or Firm* — JCIPRNET

(57) ABSTRACT

A sensing device including a substrate, a switching element, a sensing element and a common electrode is provided. The switching element is disposed on the substrate and includes a source electrode. The sensing element is disposed at one side of the switching element and includes a lower electrode, a photoelectric conversion layer and an upper electrode. The lower electrode is electrically connected to the source electrode. The photoelectric conversion layer is disposed on the lower electrode. The upper electrode is disposed on the photoelectric conversion layer. The common electrode is electrically connected to the upper electrode and belongs to the same film layer as the source electrode. A fabricating method of a sensing device is also provided.

9 Claims, 9 Drawing Sheets

(51) Int. Cl.

| | |
|---|---|
| ***H10F 39/12*** | (2025.01) |
| ***H10F 77/169*** | (2025.01) |
| ***H10F 77/20*** | (2025.01) |

(56) References Cited

U.S. PATENT DOCUMENTS

| | | | | |
|---|---|---|---|---|
| 9,985,061 | B2 | 5/2018 | Miyamoto et al. | |
| 10,340,389 | B2 | 7/2019 | Kong et al. | |
| 10,475,824 | B2 | 11/2019 | Ren et al. | |
| 11,296,249 | B2 | 4/2022 | Zhou et al. | |
| 11,502,115 | B2 * | 11/2022 | Suzuki | H10D 30/6755 |
| 12,563,838 | B2 * | 2/2026 | Suzuki | H10D 30/6723 |
| 2004/0235261 | A1 * | 11/2004 | Konishi | H10F 39/026 257/E27.132 |
| 2011/0042667 | A1 * | 2/2011 | Kawamura | H10D 30/6755 257/E29.1 |
| 2016/0225814 | A1 * | 8/2016 | Ho | H10F 39/8037 |
| 2017/0025548 | A1 * | 1/2017 | Yamazaki | H10D 86/60 |
| 2017/0092673 | A1 | 3/2017 | Miyamoto et al. | |
| 2017/0104090 | A1 * | 4/2017 | Koezuka | H10D 99/00 |
| 2017/0170218 | A1 * | 6/2017 | Park | H10F 39/811 |
| 2017/0207346 | A1 | 7/2017 | Kong et al. | |
| 2018/0114866 | A1 * | 4/2018 | Lee | H10D 30/6715 |
| 2019/0019813 | A1 * | 1/2019 | Ren | H10D 86/60 |
| 2021/0050469 | A1 | 2/2021 | Zhou et al. | |
| 2022/0376076 | A1 * | 11/2022 | Kaneko | H10D 99/00 |

FOREIGN PATENT DOCUMENTS

| | | |
|---|---|---|
| CN | 110444553 | 11/2019 |
| CN | 112018212 | 12/2020 |
| CN | 113451332 | 9/2021 |
| KR | 20190028194 | 3/2019 |
| WO | 2015141777 | 9/2015 |

OTHER PUBLICATIONS

X. He et al., “Characteristics of double-gate a-IGZO TFT,” 2014 12th IEEE International Conference on Solid-State and Integrated Circuit Technology (ICSICT), Guilin, China, 2014, pp. 1-3 (Year: 2014).*

* cited by examiner

20

Dy
Dz
Dx

SENSING DEVICE AND FABRICATING METHOD OF THE SAME

CROSS-REFERENCE TO RELATED APPLICATION

This application claims the priority benefits of U.S. provisional application Ser. No. 63/300,734, filed on Jan. 19, 2022, and Taiwanese application serial no. 111120409, filed on Jun. 1, 2022. The entirety of each of the above-mentioned patent applications is hereby incorporated by reference herein and made a part of this specification.

BACKGROUND

Technical Field

The disclosure relates to a sensing device and a fabricating method thereof.

Description of Related Art

Optical sensors have been widely used in fields such as security inspection, industrial inspection, and medical diagnosis due to their excellent performance. For example, in medical diagnosis, X-ray sensors may be used on image capturing of human chest cavity, blood vessels, teeth, etc. Generally, such type of sensors mainly includes a thin film transistor (TFT) and a PIN diode, and the PIN diode may convert optical energy into an electric signal, while the TFT is used to read the electric signal measured by the PIN diode.

Conventionally, a fabricating process of such type of sensors is to fabricate the PIN diode after fabrication of the TFT is completed. Since the TFT and the PIN diode are individually fabricated one after another, a number of masks in the fabrication process is large, and fabrication steps are complicated and time-consuming. Therefore, how to integrate the fabrication processes of the TFT and the PIN diode is one of the most challenging research and development issues at present.

SUMMARY

The disclosure is directed to a sensing device, which has a structure integrating a switching element and a sensing element.

The disclosure is directed to a sensing device, which has good reliability.

The disclosure is directed to a fabricating method of a sensing device, which integrate fabricating processes of a switching element and a sensing element, simplify fabricating steps of the sensing device, and provide the sensing device with good reliability.

An embodiment of the disclosure provides a sensing device including a substrate; a switching element disposed on the substrate and including a source electrode; a sensing element disposed at one side of the switching element and including a lower electrode electrically connected to the source electrode; a photoelectric conversion layer disposed on the lower electrode; and an upper electrode disposed on the photoelectric conversion layer; and a common electrode electrically connected to the upper electrode and belonging to the same film layer as the source electrode.

An embodiment of the disclosure provides a sensing device including a substrate; a switching element disposed on the substrate and including a semiconductor layer; a gate surrounding the semiconductor layer; and a sensing element located on the substrate and including a lower electrode; an upper electrode overlapping the lower electrode; and a photoelectric conversion layer disposed between the upper electrode and the lower electrode.

The disclosure provides a fabricating method of a sensing device including: forming a semiconductor layer on a substrate; forming a first insulating layer on the semiconductor layer; forming a blanket-covering conductor layer on the first insulating layer and the substrate; forming a blanket-covering semiconductor stacked layer on the conductor layer; forming a blanket-covering transparent electrode layer on the semiconductor stacked layer; patterning the transparent electrode layer to form an upper electrode; patterning the semiconductor stacked layer to form a photoelectric conversion layer; and patterning the conductor layer to form a lower electrode and a top gate.

To make the aforementioned more comprehensible, several embodiments accompanied with drawings are described in detail as follows.

BRIEF DESCRIPTION OF THE DRAWINGS

FIG. 1G is a schematic partial cross-sectional view of the sensing device 10 according to an embodiment of the disclosure.

DESCRIPTION OF THE EMBODIMENTS

Figure 1A:
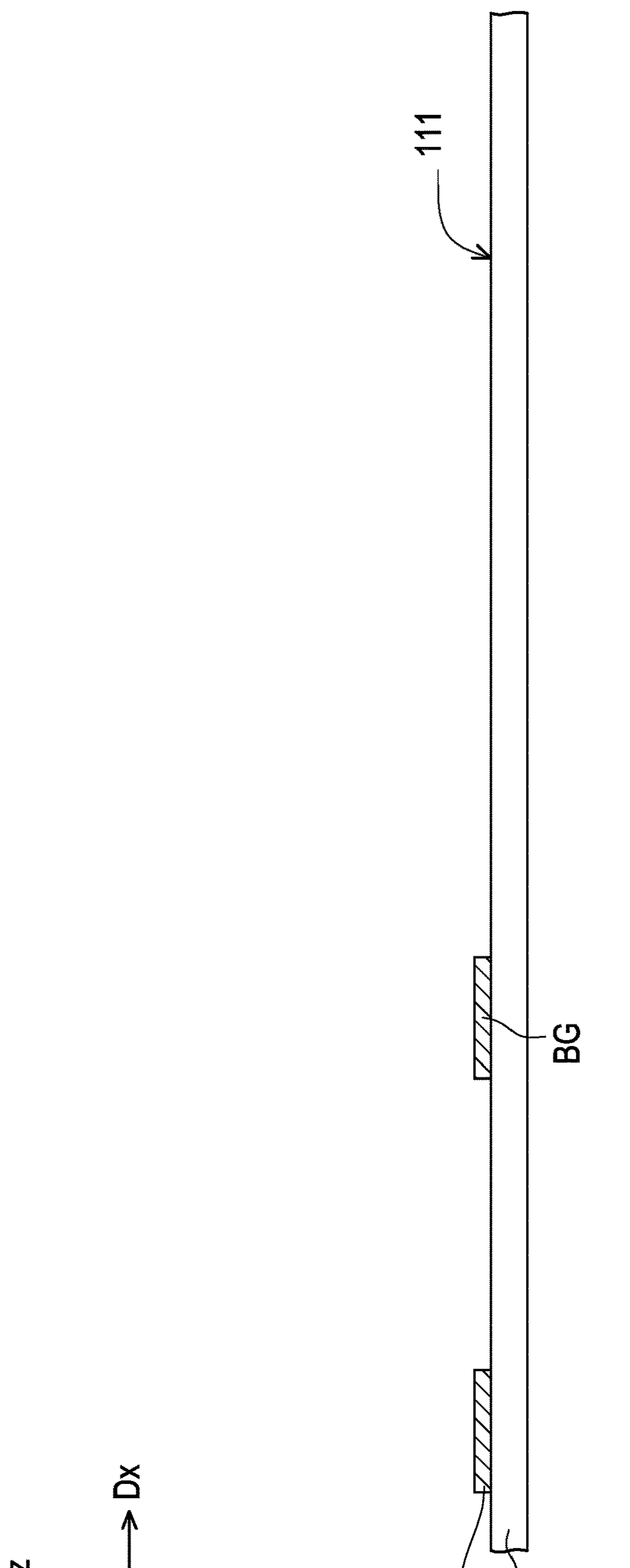
FIG. 1A to FIG. 1G are schematic partial cross-sectional views and schematic partial top views of steps of a fabricating method of a sensing device 10 according to an embodiment of the disclosure.

In the drawings, the thickness of layers, films, panels, regions, etc., are exaggerated for clarity's sake. The same reference numerals refer to the same elements throughout the specification. It will be understood that when a component such as a layer, a film, a region, or a substrate is referred to be "on" or "connected to" another component, it may be directly on or connected to the other another component, or intermediate components may also exist there between. Comparatively, when a component is referred to be "directly on" or "directly connected" to another, none other intermediate component exits there between. As used herein, the "connection" may refer to physical and/or electrical connection. Furthermore, "electrical connection" of two components may refer to that other components may exist between the two components.

It should be understood that although the terms "first", "second", "third", etc. may be used for describing various elements, components, regions, layers and/or portions, the elements, components, regions, layers and/or portions are not limited by these terms. These terms are only used for separating one element, component, region, layer or portion from another element, component, region, layer or portion. Therefore, the following discussed "first element", "component", "region", "layer" or "portion" may be referred to as the second element, component, region, layer or portion without departing from the scope of the disclosure.

The terminology used herein is for the purpose of describing particular embodiments and is not intended to be limiting of the disclosure. As used herein, the singular forms "a," "an" and "the" are intended to include the plural forms as well, including "at least one" or represents "and/or", unless the context clearly indicates otherwise. The term "and/or" used herein includes any or a combination of one or more of the associated listed items. It will be further understood that the terms "comprises," "comprising," "includes" and/or "including," when used herein, specify the presence of stated features, regions, integers, steps, operations, elements, and/or components, but do not preclude the presence or addition of one or more other features, regions, integers, steps, operations, elements, components, and/or groups thereof.

Moreover, relative terms such as "under" or "bottom" and "above" or "top" may be used for describing a relationship of one element and another element as that shown in figures. It should be noted that the relative terms are intended to include a different orientation of the device besides the orientation shown in the figure. For example, if a device in a figure is flipped over, the element originally described to be located "under" other element is oriented to be located "above" the other element. Therefore, the illustrative term "under" may include orientations of "under" and "on", which is determined by the specific orientation of the figure. Similarly, if a device in a figure is flipped over, the element originally described to be located "below" or "underneath" other element is oriented to be located "on" the other element. Therefore, the illustrative term "under" or "below" may include orientations of "above" and "under".

Considering the discussed measurement and a specific number of errors associated with the measurement (i.e., limitations of the measurement system), the terms "about", "substantial" or "approximate" used herein include the related value and an average within an acceptable deviation range for a specific value determined by those skilled in the art. For example, "about" may represent a range within one or a plurality of standard deviations of the related value, or within ±30%, ±20%, ±10%, ±5%. Moreover, the "about", "substantially", or "approximate" used herein may be a more acceptable deviation range or standard deviation based on optical properties, etching properties, or other properties, and not one standard deviation may be applied to all properties.

Unless otherwise defined, all terms (including technical and scientific terms) used herein have the same meaning as commonly understood by one of ordinary skill in the art to which this disclosure belongs. It will be further understood that terms, such as those defined in commonly used dictionaries, should be interpreted as having a meaning that is consistent with their meaning in the context of the relevant art and will not be interpreted in an idealized or overly formal sense unless expressly so defined herein.

The exemplary embodiment is described below with reference of a cross-sectional view of a schematic diagram of an idealized embodiment. Therefore, a shape change of the figure serving as a result of manufacturing techniques and/or tolerances may be expected. Therefore, the embodiment of the disclosure should not be construed as limited to a particular shape of a region as shown herein, but includes a shape deviation caused by manufacturing tolerance. For example, a shown or described flat area may generally have rough and/or non-linear features. Moreover, a shown acute angle may be round. Therefore, a region shown in the figure is essentially schematic, and a shape thereof is not intended to show an accurate shape of the region, and is not intended to limit a range of the claims of the disclosure.

FIG. 1A to FIG. 1G are schematic partial cross-sectional views and schematic partial top views of steps of a fabricating method of a sensing device 10 according to an embodiment of the disclosure. Hereinafter, the fabricating method of the sensing device 10 will be described with reference to FIG. 1A to FIG. 1G.

Referring to FIG. 1A, in some embodiments, a bottom gate BG and a scan line SL may be formed on a substrate 110 first. The substrate 110 may be a rigid substrate, such as a glass substrate, a quartz substrate or a silicon substrate, but the disclosure is not limited thereto. In other embodiments, the substrate 110 may be a flexible substrate, such as a polymer substrate or a plastic substrate. In the specification, a normal direction of the substrate 110 may be a direction Dz perpendicular to a surface 111 of the substrate 110, and the direction Dz may be perpendicular to a direction Dx and a direction Dy.

For example, a method for forming the bottom gate BG and the scan line SL may include following steps. First, a conductive layer (not shown) is formed on the substrate 110. Then, a patterned photoresist (not shown) is formed on the conductive layer by a lithography process. Then, the patterned photoresist is used as a mask to perform an etching process on the conductive layer to form the bottom gate BG and the scan line SL. Thereafter, the patterned photoresist is removed.

For example, materials of the bottom gate BG and the scan line SL may include metals such as chromium (Cr), gold (Au), silver (Ag), copper (Cu), tin (Sn), lead (Pb), hafnium (Hf), tungsten (W), molybdenum (Mo), neodymium (Nd), titanium (Ti), tantalum (Ta), aluminum (Al), zinc (Zn), or an alloy of any combination of the above metals, or a stacked layer of the above metals and/or alloys, but the disclosure is not limited thereto. The bottom gate BG and scan line SL may also be made of other conductive materials, such as metal nitride, metal oxide, metal oxynitride, stacked layers of metal and other conductive materials, or other materials with conductive properties.

Figure 1B:
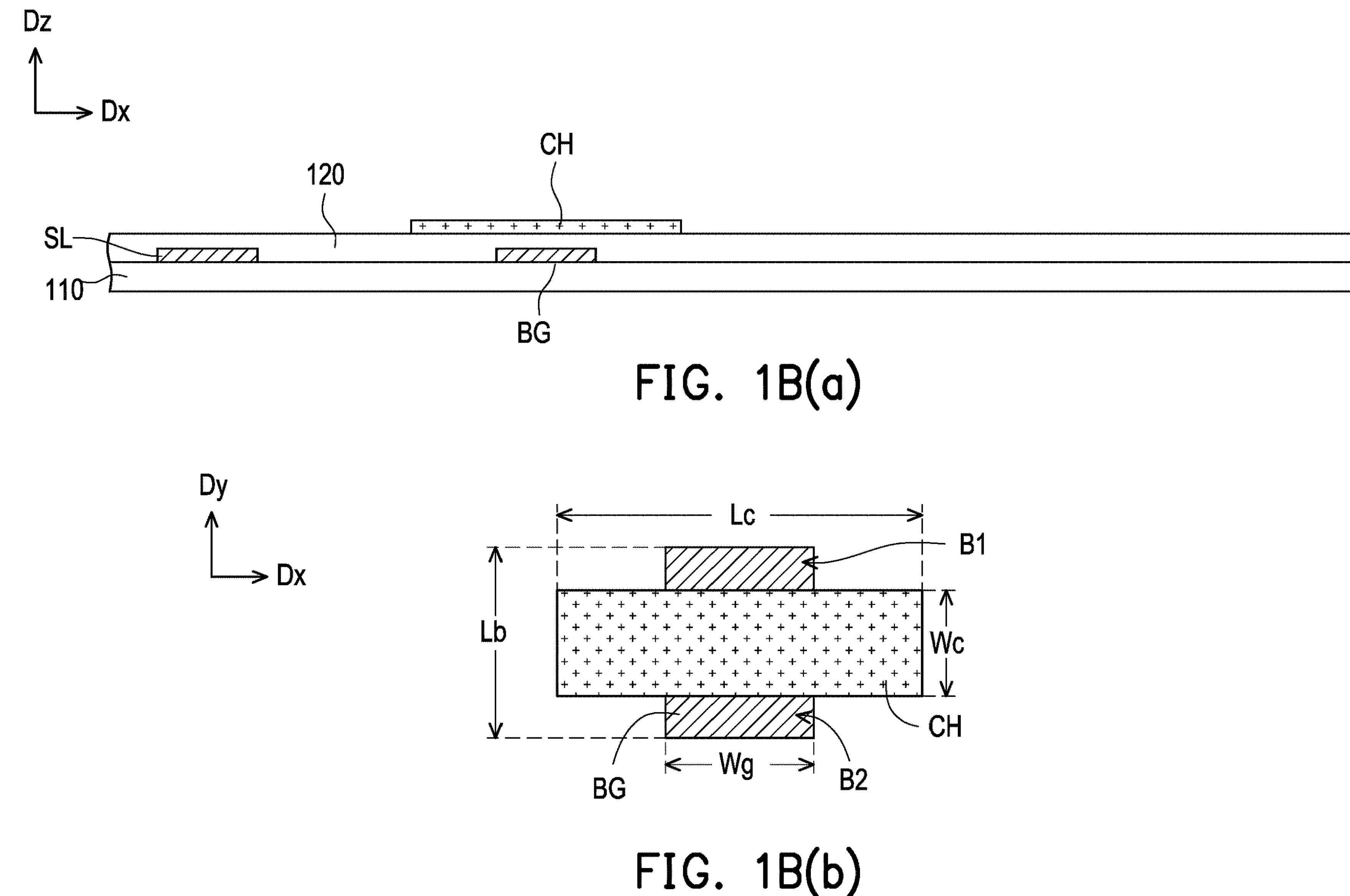

Referring to FIG. 1B(a), in the embodiment, a blanket-covering insulating layer 120 may be formed on the substrate 110, and the insulating layer 120 may be formed by chemical vapor deposition or other suitable methods to block impurities in the substrate 110. In some embodiments, the insulating layer 120 may cover the bottom gate BG and the scan line SL to avoid unnecessary electrical connections. A material of the insulating layer 120 may include a transparent insulating material, such as silicon oxide, silicon nitride, silicon oxynitride, organic polymer or a stacked layer of the above materials, but the disclosure is not limited thereto.

Then, referring to FIG. 1B(a) and FIG. 1B(b), a semiconductor layer CH is formed on the substrate 110 and the insulating layer 120. In some embodiments, the semiconductor layer CH may partially overlap the bottom gate BG, and orthogonal projections of the semiconductor layer CH and the bottom gate BG on the substrate 110 may present a cross pattern. For example, a length Lc of the semiconductor layer CH in the direction Dx may be greater than a width Wg of the bottom gate BG in the direction Dx, and a width We of the semiconductor layer CH in the direction Dy may be smaller than a length Lb of the bottom gate BG in the direction Dy, and the direction Dx is substantially perpendicular to the direction Dy, so that orthogonal projections of two end portions B1 and B2 of the bottom gate BG in the direction Dy on the substrate 110 are outside the orthogonal projection of the semiconductor layer CH on the substrate 110.

A method for forming the semiconductor layer CH may include following steps: first, a blanket-covering semiconductor material layer (not shown) is formed on the insulating layer 120. Then, a lithography process is used to form a patterned photoresist (not shown) on the semiconductor material layer. Then, the patterned photoresist is used as a mask to perform an etching process on the semiconductor material layer to form the semiconductor layer CH. Thereafter, the patterned photoresist is removed.

A material of the semiconductor layer CH may include metal oxide semiconductor materials, such as: at least one of indium gallium zinc oxide (InGaZnO, IGZO), indium zinc oxide (InZnO, IZO), indium gallium oxide (InGaO, IGO), indium tin oxide (InSnO, ITO), indium gallium zinc tin oxide (InGaZnSnO, IGZTO), gallium zinc tin oxide (GaZnSnO, GZTO), gallium zinc oxide (GaZnO, GZO), zinc tin oxide (ZnSnO, ZTO) and indium tin zinc oxide (InSnZnO, ITZO), but the disclosure is not limited thereto.

Figure 1C:
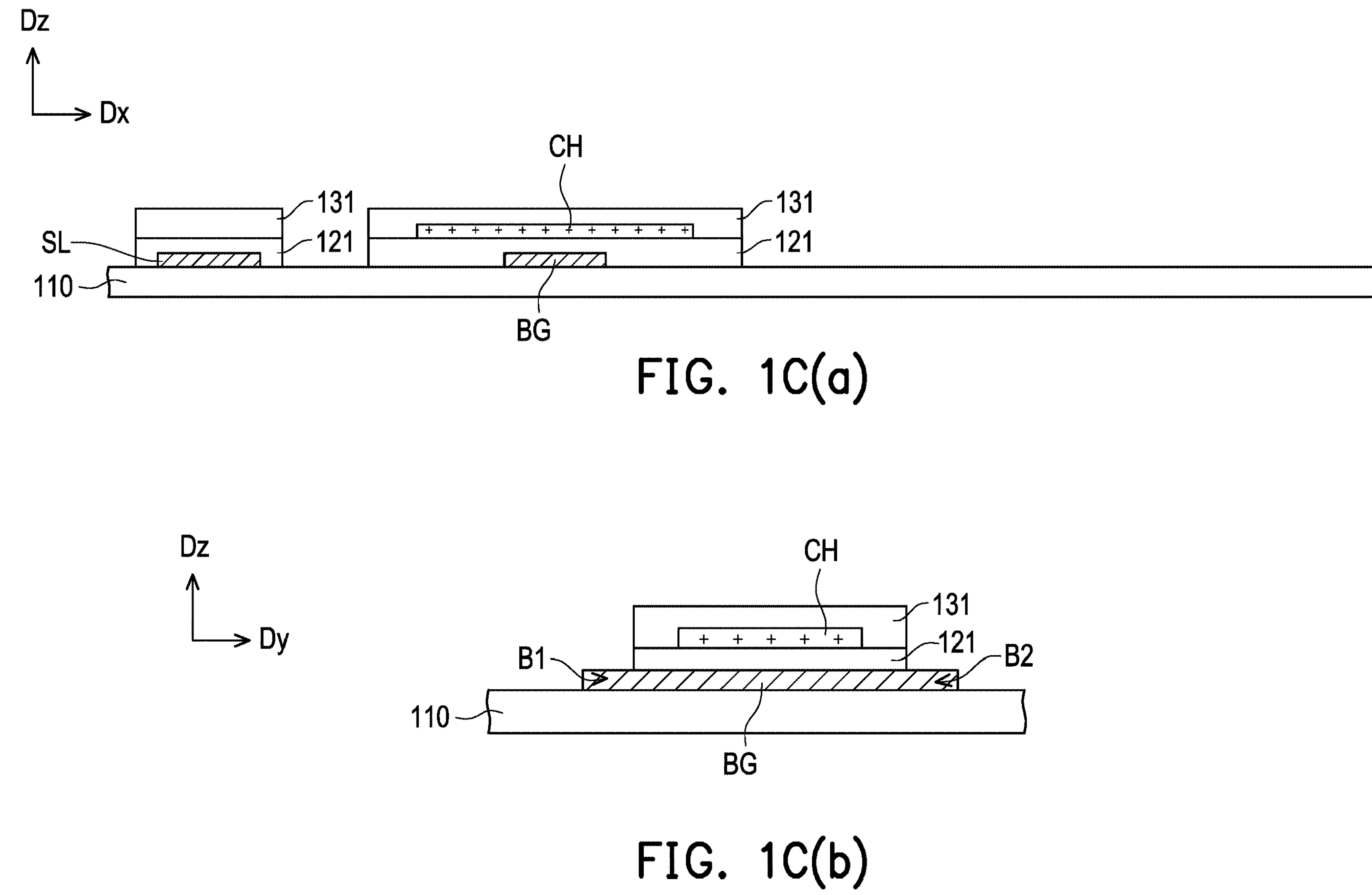

Referring to FIG. 1C(a), insulating layers 121 and 131 are formed on the substrate 110, and the insulating layer 121 may cover the bottom gate BG and the scan line SL, and the insulating layer 131 may cover the semiconductor layer CH, and the insulating layer 131 may overlap the insulating layer 121 on the scan line SL. A method of forming the insulating layers 121 and 131 may include following steps. First, a blanket-covering insulating layer (not shown) is formed on the insulating layer 120 and the semiconductor layer CH. Then, a lithography process is used to form a patterned photoresist (not shown) on the above blanket-covering insulating layer. Then, the patterned photoresist is used as a mask to perform an etching process on the above blanket-covering insulating layer and the insulating layer 120 to form the insulating layers 121 and 131. Thereafter, the patterned photoresist is removed. The above blanket-covering insulating layer may be formed by chemical vapor deposition or other suitable methods, and a material of the above blanket-covering insulating layer may include a transparent insulating material, such as silicon oxide, silicon nitride, silicon oxynitride, organic polymer or a stacked layer of the above-mentioned materials, but the disclosure is not limited thereto. In some embodiments, the insulating layers 121 and 131 may be formed in the same etching process, but the disclosure is not limited thereto.

Referring to FIG. 1C(b), in some embodiments, orthogonal projections of the two end portions B1 and B2 of the bottom gate BG in the direction Dy on the substrate 110 may be outside orthogonal projections of the insulating layers 121 and 131 on the substrate 110. In other words, the insulating layers 121 and 131 may not overlap each other and expose the two end portions B1 and B2 of the bottom gate BG.

Figures 1D, 1E:
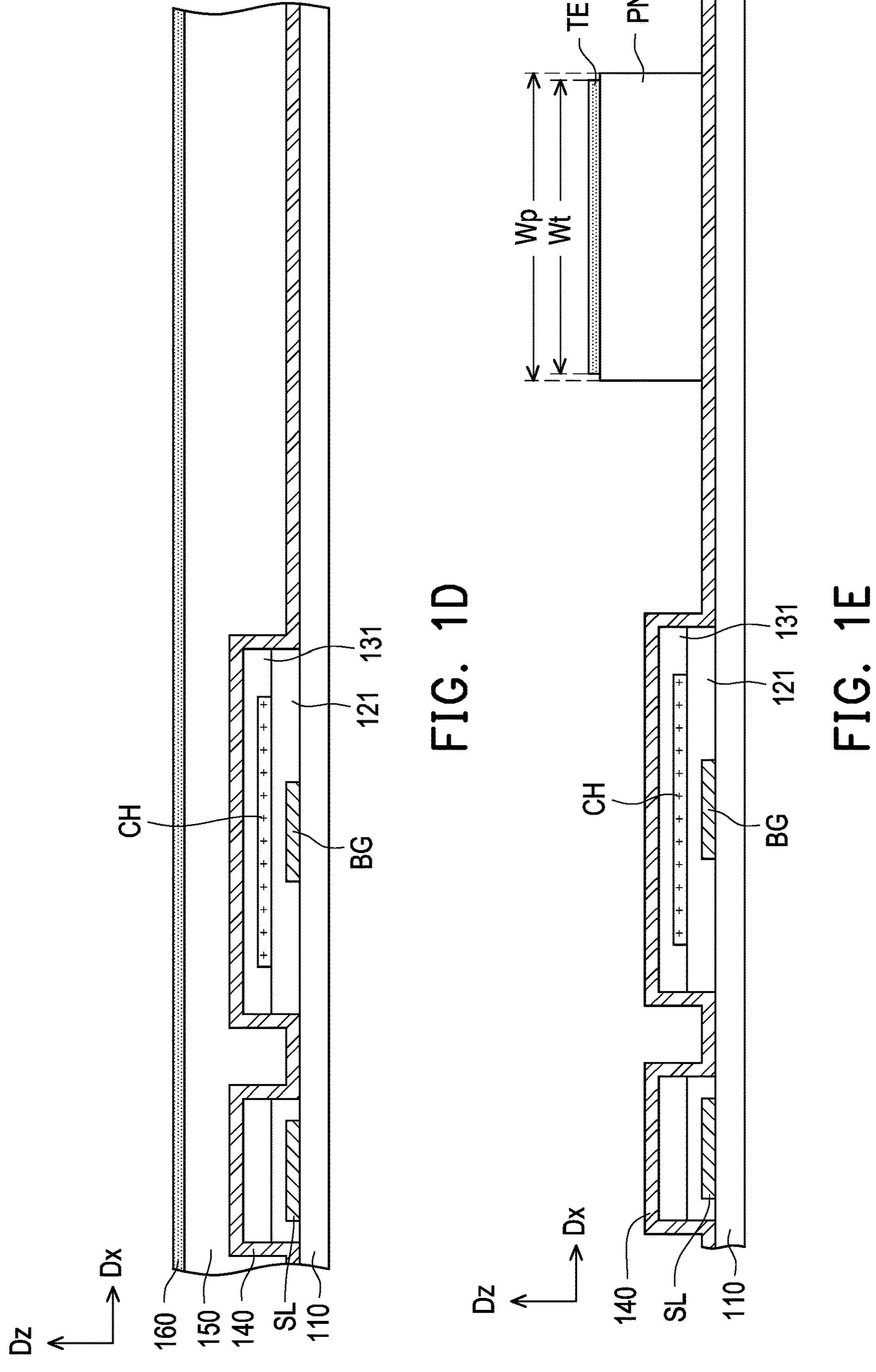

Referring to FIG. 1D, a blanket-covering conductor layer 140 is formed on the insulating layer 131 and the substrate 110, a blanket-covering semiconductor stacked layer 150 is formed on the conductor layer 140, and a blanket-covering transparent electrode layer 160 is formed on the semiconductor stacked layer 150. The conductor layer 140, the semiconductor stacked layer 150, and the transparent electrode layer 160 may be formed by chemical vapor deposition, physical vapor deposition, or other suitable methods.

For example, a material of the conductor layer 140 may include metals such as chromium (Cr), gold (Au), silver (Ag), copper (Cu), tin (Sn), lead (Pb), hafnium (Hf)), tungsten (W), molybdenum (Mo), neodymium (Nd), titanium (Ti), tantalum (Ta), aluminum (Al), zinc (Zn), or an alloy of any combination of the above metals, or a stacked layer of the above metals and/or alloys, but the disclosure is not limited thereto. The conductor layer 140 may also include other conductive materials, such as metal nitrides, metal oxides, metal oxynitrides, a stacked layer of metals and other conductive materials, or other materials with conductive properties.

In some embodiments, the semiconductor stacked layer 150 may include an N-type semiconductor material layer, an intrinsic semiconductor material layer, and a P-type semiconductor material layer sequentially formed on the conductor layer 140. For example, the intrinsic semiconductor material layer is, for example, intrinsic amorphous silicon deposited by a plasma-enhanced chemical vapor deposition (PECVD) process by using silicon methane ($SiH_4$) and hydrogen ($H_2$) as reactive gases. The N-type semiconductor material layer is, for example, phosphorus (P)-doped amorphous silicon formed by using phosphine ($PH_3$), hydrogen ($H_2$), and silicon methane ($SiH_4$) as reactive gases. The P-type semiconductor material layer is, for example, boron (B)-doped amorphous silicon formed by using trimethyl borate, hydrogen ($H_2$) and silicon methane ($SiH_4$) as reactive gases, but the disclosure is not limited thereto.

A material of the transparent electrode layer 160 may include indium tin oxide, indium zinc oxide, aluminum zinc oxide (AlZO), aluminum indium oxide (AlInO), indium oxide (InO), gallium oxide (GaO), nano carbon nanotubes, nanosilver particles, metals or alloys with a thickness of less than 60 nanometers (nm), organic transparent conductive materials, or other suitable transparent conductive materials.

Referring to FIG. 1E, the transparent electrode layer 160 is patterned to form an upper electrode TE on the semiconductor stacked layer 150. In detail, the patterning of the transparent electrode layer 160 may include following steps. First, a patterned photoresist (not shown) is formed on the transparent electrode layer 160 by a lithography process. Then, the patterned photoresist is used as a mask to perform a wet etching process on the transparent electrode layer 160 to form the upper electrode TE. An etchant used in the wet etching process is, for example, oxalic acid or aluminic acid, but the disclosure is not limited thereto. Thereafter, the patterned photoresist is removed.

Then, the semiconductor stacked layer 150 is patterned to form a photoelectric conversion layer PN. For example, patterning of the semiconductor stacked layer 150 may include following steps. First, a lithography process is used to form a patterned photoresist (not shown) on the upper electrode TE and the semiconductor stacked layer 150. Then, the patterned photoresist is used as a mask to perform a dry etching process on the semiconductor stacked layer 150 to form the photoelectric conversion layer PN. Etching gases used in the dry etching process include, but are not limited to, gases such as sulfur hexafluoride ($SF_6$) and chlorine ($Cl_2$). Thereafter, the patterned photoresist is removed.

In some embodiments, patterning of the transparent electrode layer 160 and patterning of the semiconductor stacked layer 150 may use the same mask. Since patterning of the transparent electrode layer 160 uses a wet etching process, during the wet etching process, the etchant further removes a portion of the transparent electrode layer 160 under an edge of the patterned photoresist, so that a size Wt of the upper electrode TE formed after the wet etching process is smaller than a size of the patterned photoresist. In addition, since patterning of the semiconductor stacked layer 150 uses a dry etching process, a size Wp of the photoelectric conversion layer PN formed after the dry etching process may be similar to or equal to the size of the patterned photoresist, so that the size Wt of the upper electrode TE may be smaller than the size Wp of the photoelectric conversion layer PN.

It should be noted that in the process of forming and patterning the semiconductor stacked layer 150, the semiconductor layer CH is completely covered under the blanket-covering conductor layer 140, so that the blanket-covering conductor layer 140 may effectively block hydrogen ions (H+) in the reactive gases from the semiconductor layer CH to prevent hydrogen ions from entering the semiconductor layer CH to affect the properties of the semiconductor layer CH, thereby preventing the reliability of the sensing device 10 from being affected.

Figure 1F:
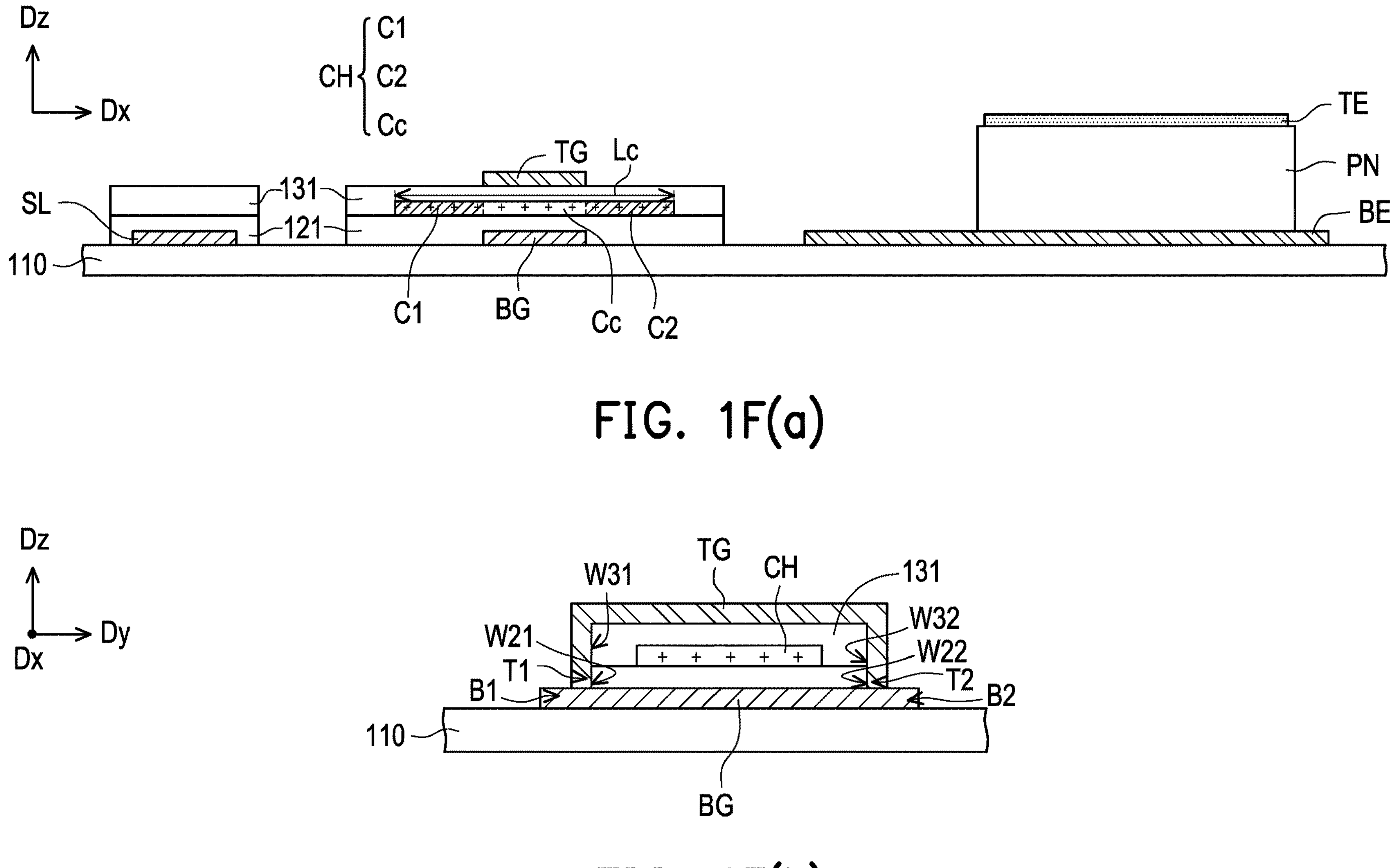

Referring to FIG. 1F(a), the conductor layer 140 is patterned to form a lower electrode BE and a top gate TG. The patterning of the conductor layer 140 may include following steps. First, a patterned photoresist (not shown) is formed on the conductor layer 140 by a lithography process. Then, the patterned photoresist is used as a mask to perform an etching process on the conductor layer 140 to form the lower electrode BE and the top gate TG. In other words, the lower electrode BE and the top gate TG belong to the same film layer. Thereafter, the patterned photoresist is removed.

Referring to FIG. 1F(b), in some embodiments, the top gate TG may also extend downward along two opposite sidewalls W31 and W32 of the insulating layer 131 and two opposite sidewalls W21 and W22 of the insulating layer 121 to the two end portions B1 and B2 of the bottom gate BG, so that two end portions T1 and T2 of the top gate TG may be physically connected to the two end portions B1 and B2 of the bottom gate BG respectively to form an annular gate GE, and the gate GE may surround the semiconductor layer CH, and a central axis of the gate GE may extend along an extending direction (i.e., the direction Dx) of the length Lc of the semiconductor layer CH. In some embodiments, the central axis of the gate GE may fall into the semiconductor layer CH. In some embodiments, the central axis of the gate GE may overlap a central axis of the semiconductor layer CH in the direction Dx.

In some embodiments, after the top gate TG is formed, a doping process may also be performed. In the doping process, the top gate TG may be used as a mask to dope the semiconductor layer CH. After the doping process, a region of the semiconductor layer CH overlapping the top gate TG may become a channel region Cc, a region of the semiconductor layer CH not overlapping the top gate TG may become a drain region C1 and a source region C2, and the drain region C1 and the source region C2 may have a lower resistance than the channel region Cc. For example, the doping process may implant hydrogen into the drain region C1 and the source region C2 of the semiconductor layer CH, so that a carrier mobility of the drain region C1 and the source region C2 of the semiconductor layer CH increases. In some embodiments, the doping process may be a hydrogen plasma treatment. In some embodiments, the drain region C1 and the source region C2 of the semiconductor layer CH may respectively form ohmic contacts with a drain and a source formed subsequently.

Figure 1G:
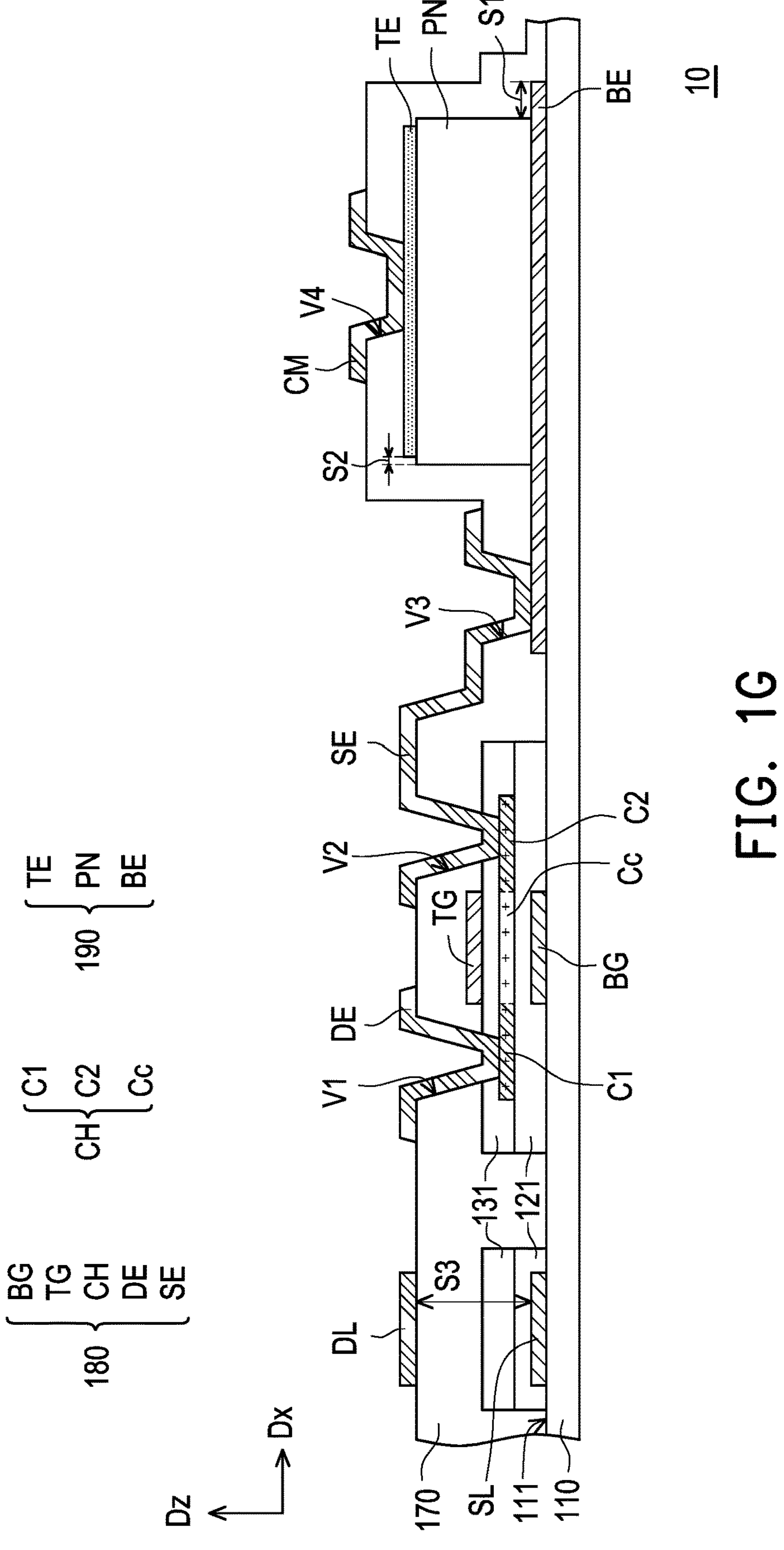

Referring to FIG. 1G, an insulating layer 170 is formed on the substrate 110. A method of forming the insulating layer 170 may include the following steps. First, a dielectric material layer (not shown) is formed on the substrate 110 by chemical vapor deposition or other suitable methods. Then, a lithography process is used to form a patterned photoresist (not shown) on the dielectric material layer. Then, an etching process is performed on the dielectric material layer by using the patterned photoresist as a mask to form the insulating layer 170 having through holes V1, V2, V3, and V4. Thereafter, the patterned photoresist is removed. In the embodiment, the through holes V1 and V2 may further penetrate through the insulating layer 131 to respectively expose the drain region C1 and the source region C2 of the semiconductor layer CH, the through hole V3 may expose the lower electrode BE, and the through hole V4 may expose the upper electrode TE.

Then, a drain electrode DE, a source electrode SE, a common electrode CM and a data line DL are formed on the insulating layer 170, where the drain electrode DE is electrically connected to the drain region C1 of the semiconductor layer CH through the through hole V1, and the source electrode SE is electrically connected to the source region C2 of the semiconductor layer CH through the through hole V2, the source electrode SE is also electrically connected to the lower electrode BE through the through hole V3, the common electrode CM is located on the upper electrode TE, and the common electrode CM is electrically connected to the upper electrode TE through the through hole V4. Since the common electrode CM, the drain electrode DE, the source electrode SE and the data line DL may be formed in the same fabricating process, the number of masks in the fabricating process may be reduced, thereby simplifying the process steps.

FIG. 1G is a schematic partial cross-sectional view of the sensing device 10 according to an embodiment of the disclosure. In the embodiment, the sensing device 10 may include a substrate 110, a switching element 180, a sensing element 190 and a common electrode CM, and the switching element 180, the sensing element 190 and the common electrode CM are all disposed on the substrate 110. The sensing element 190 is, for example, a PIN diode, which is used for converting optical energy into an electronic signal. The switching element 180 is, for example, a thin film transistor, which is used for reading the signal measured by the sensing element 190.

The switching element 180 includes at least the source electrode SE. For example, in the embodiment, the switching element 180 may include the semiconductor layer CH, the source electrode SE, the drain electrode DE, and the top gate TG, and the insulating layer 121 is located between the semiconductor layer CH and the substrate 110, the insulating layer 131 is located between the semiconductor layer CH and the top gate TG, the insulating layer 170 is located between the source electrode SE, the drain electrode DE and the top gate TG, the insulating layers 131 and 170 are located between the source electrode SE, the drain electrode DE and the semiconductor layer CH, the drain electrode DE is electrically connected to the drain region C1 of the semiconductor layer CH, and the source electrode SE is electrically connected to the source region C2 of the semiconductor layer CH. Therefore, the switching element 180 may be a top-gate type thin film transistor.

In some embodiments, the switching element 180 may include the semiconductor layer CH, the source electrode SE, the drain electrode DE, the top gate TG and the bottom gate BG, and the semiconductor layer CH is located between the bottom gate BG and the top gate TG, the insulating layer 121 is located between the bottom gate BG and the semiconductor layer CH, the insulating layer 131 is located between the semiconductor layer CH and the top gate TG, the insulating layer 170 is located between the source electrode SE, the drain electrode DE and the top gate TG, the insulating layers 131 and 170 are located between the source electrode SE, the drain electrode DE and the semiconductor layer CH, the semiconductor layer CH is located between the bottom gate BG and the top gate TG, the drain electrode DE is electrically connected to the drain region C1 of the semiconductor layer CH, and the source electrode SE is electrically connected to the source region C2 of the semiconductor layer CH. Therefore, the switching element 180 may be a double-gate type thin film transistor.

In some embodiments, the switching element 180 may include the semiconductor layer CH, the source electrode SE, the drain electrode DE and the bottom gate BG, where the insulating layer 121 is located between the bottom gate BG and the semiconductor layer CH, the insulating layers 131 and 170 are located between the source electrode SE, the drain electrode DE and the semiconductor layer CH, the drain electrode DE is electrically connected to the drain region C1 of the semiconductor layer CH, and the source electrode SE is electrically connected to the source region C2 of the semiconductor layer CH. Therefore, the switching element 180 may be a bottom-gate type thin film transistor.

In the embodiment, the sensing element 190 may be located on one side of the switching element 180, and the sensing element 190 may include the upper electrode TE, the lower electrode BE, and the photoelectric conversion layer PN, and the upper electrode TE overlaps the lower electrode BE, the upper electrode TE and the lower electrode BE are electrically independent from each other, and the photoelectric conversion layer PN is located between the upper electrode TE and the lower electrode BE; the lower electrode BE is electrically connected to the source electrode SE, and the lower electrode BE and the top gate TG belong to the same film layer; the upper electrode TE is electrically connected to the common electrode CM, and the common electrode CM and the source electrode SE belong to the same film layer. In this way, the sensing device 10 may have a structure that integrates the switching element 180 and the sensing element 190.

In some embodiments, the photoelectric conversion layer PN is disposed on the lower electrode BE, and the photoelectric conversion layer PN may completely overlap the lower electrode BE. In other words, an orthogonal projection of the photoelectric conversion layer PN on the substrate 110 may completely fall into an orthogonal projection of the lower electrode BE on the substrate 110. In some embodiments, a spacing S1 between a side wall of the photoelectric conversion layer PN and a side wall of the lower electrode BE may be 2 μm to 5 μm, for example, about 3 μm or about 4 μm. In some embodiments, the upper electrode TE may completely overlap the photoelectric conversion layer PN. In other words, an orthogonal projection of the upper electrode TE on the substrate 110 may completely fall into the orthogonal projection of the photoelectric conversion layer PN on the substrate 110. In some embodiments, a spacing S2 between the side wall of the upper electrode TE and the side wall of the photoelectric conversion layer PN may be 0.5 μm to 3 μm, for example, about 1 μm or about 2 μm.

In some embodiments, the sensing device 10 may further include a scan line SL, the scan line SL may be electrically connected to the bottom gate BG, and the scan line SL and the bottom gate BG may belong to the same film layer. In addition, the sensing device 10 may further include a data line DL, the data line DL may be electrically connected to the drain electrode DE, and the data line DL and the source electrode SE and the drain electrode DE may belong to the same film layer. In this way, there are at least the insulating layers 121, 131 and 170 between the scan line SL and the data line DL, so that a spacing between the scan line SL and the data line DL at the intersection may be increased, so as to reduce a parasitic capacitance of the scan line SL and the data line DL, and accordingly mitigate an electrostatic discharge (ESD) problem. In some embodiments, in a normal direction Dz of the substrate 110, a spacing S3 between the scan line SL and the data line DL is 3,000-12,000 Å, preferably 5,000-10,000 Å, such as about 6,000 Å or 8,000 Å, but the disclosure is not limited thereto.

Hereinafter, other embodiments of the disclosure will continue to be described with reference to FIG. 2A to FIG. 2C, and the element reference numerals and related contents of the embodiments of FIG. 1A to FIG. 1G will be used, where the same or similar reference numerals are used to indicate the same or similar elements, and the description of the same technical content is omitted. For the description of the omitted part, reference may be made to the aforementioned embodiments, which will not be repeated.

Figure 2A:
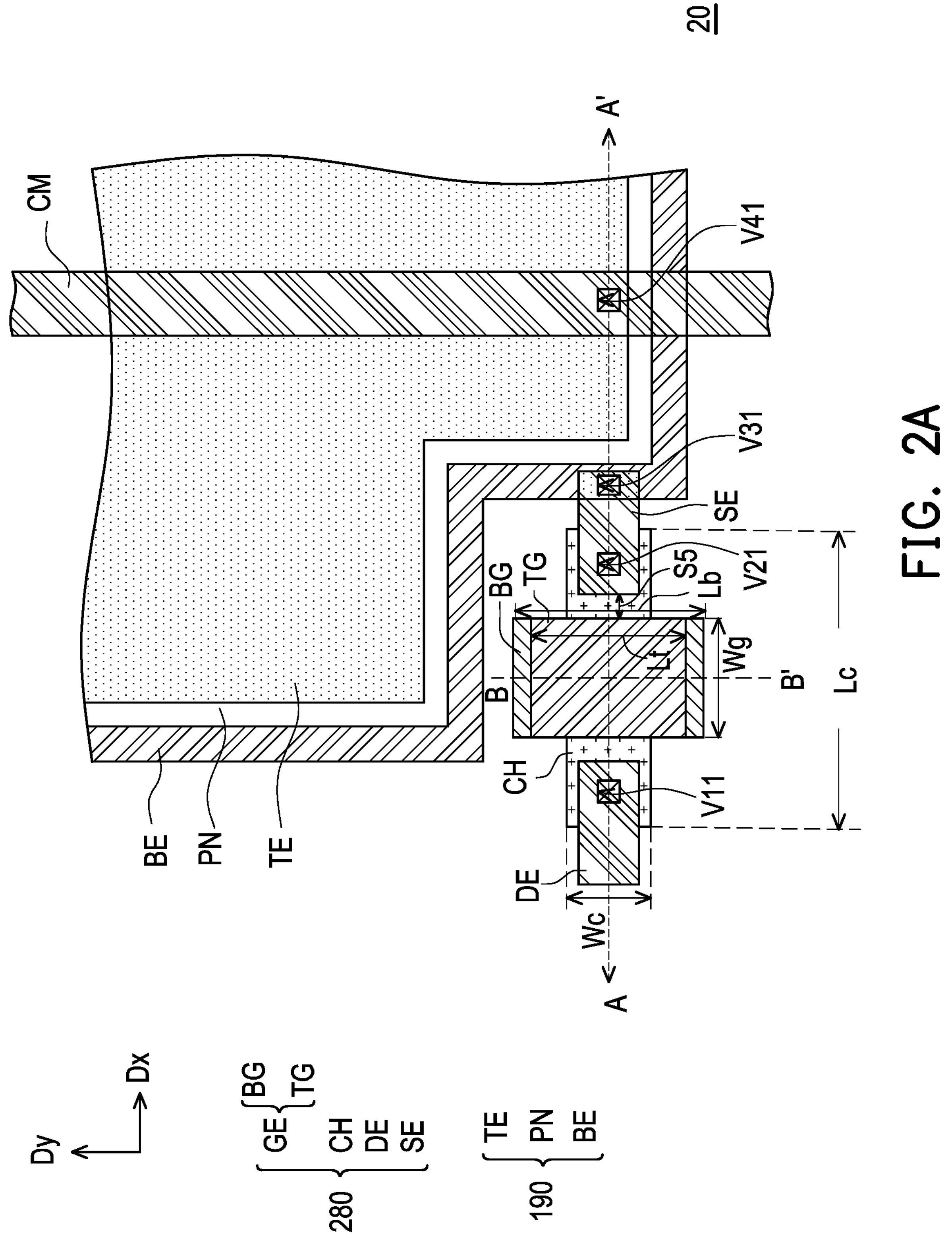
FIG. 2A is a schematic partial top view of a sensing device 20 according to an embodiment of the disclosure.

FIG. 2A is a schematic partial top view of a sensing device 20 according to an embodiment of the disclosure. FIG. 2B is a schematic cross-sectional view taken along a section line A-A' of FIG. 2A. FIG. 2C is a schematic cross-sectional view taken along a section line B-B' of FIG. 2A. In order to simplify the expression of the drawings, FIG. 2A omits illustration of the substrate 110 and the insulating layers 121, 131 and 170.

In the embodiment, the sensing device 20 may include: a substrate 110, a switching element 280, a sensing element 190 and a common electrode CM, and the switching element 280, the sensing element 190 and the common electrode CM are all disposed on the substrate 110. The sensing element 190 includes an upper electrode TE, a lower electrode BE, and a photoelectric conversion layer PN, where the upper electrode TE overlaps the lower electrode BE, and the photoelectric conversion layer PN is located between the upper electrode TE and the lower electrode BE. The lower electrode BE may be electrically connected to the source electrode SE of the switching element 280 through, for example, a through hole V31. The common electrode CM is located on the upper electrode TE, and the upper electrode TE may be electrically connected to the common electrode CM through, for example, a through hole V41.

Figure 2B:
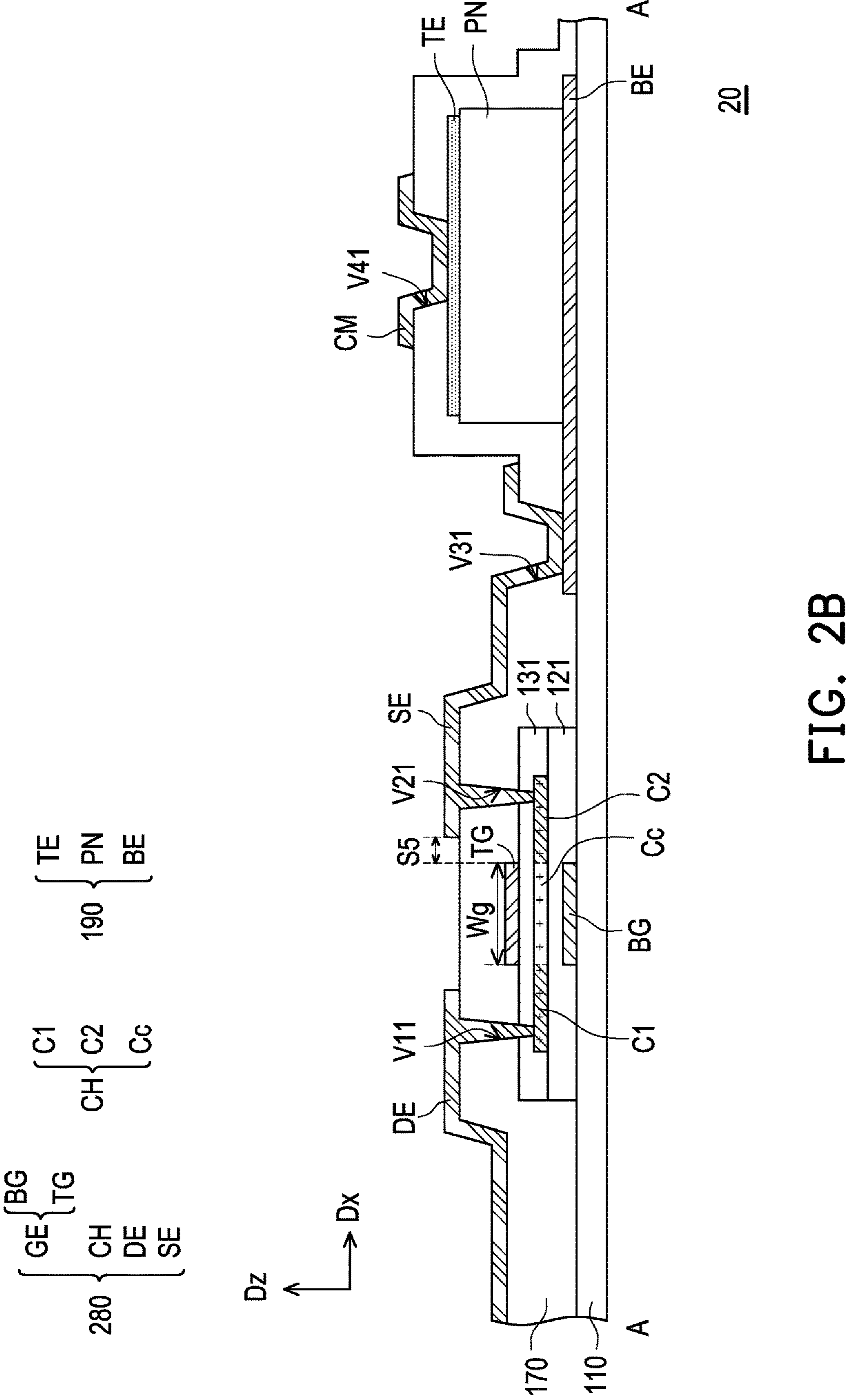
FIG. 2B is a schematic cross-sectional view taken along a section line A-A' of FIG. 2A.
Figure 2C:
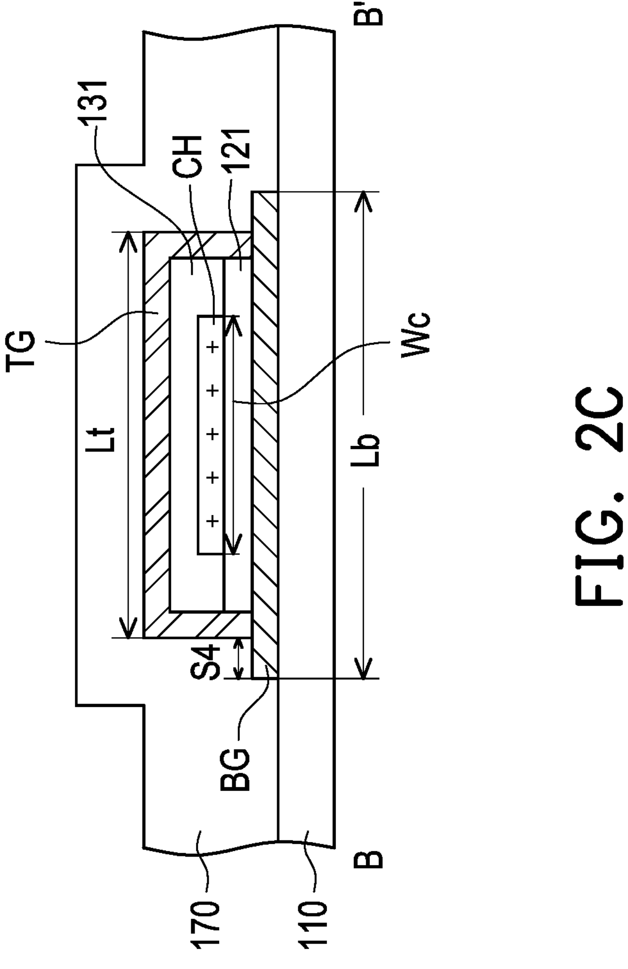
FIG. 2C is a schematic cross-sectional view taken along a section line B-B' of FIG. 2A.

A main difference between the sensing device 20 shown in FIG. 2A to FIG. 2C and the sensing device 10 shown in FIG. 1G is that the switching element 280 of the sensing device 20 at least includes a semiconductor layer CH and a gate GE, and the gate GE surrounds the semiconductor layer CH.

For example, in the embodiment, the switching element 280 may include a semiconductor layer CH, a source electrode SE, a drain electrode DE, and a gate GE, and the gate GE may include a top gate TG and a bottom gate BG. The insulating layers 121 and 131 wrap the semiconductor layer CH there between, the insulating layer 121 is located between the bottom gate BG and the semiconductor layer CH, and the insulating layer 131 is located between the semiconductor layer CH and the top gate TG. The insulating layer 170 is located between the source electrode SE, the drain electrode DE and the top gate TG, and the insulating layers 131 and 170 are located between the source electrode SE and the semiconductor layer CH and between the drain electrode DE and the semiconductor layer CH. A region of the semiconductor layer CH overlapping the top gate TG is a channel region Cc, a region of the semiconductor layer CH not overlapping the top gate TG is a drain region C1 and a source region C2, the channel region Cc connects the drain region C1 and the source electrode region C2, and the drain region C1 and the source region C2 may have lower resistances than the channel region Cc. The drain electrode DE may be electrically connected to the drain region C1 through the through hole V11, and the source electrode SE may be electrically connected to the source electrode region C2 through the through hole V21.

To be specific, the semiconductor layer CH may have a length Lc along the direction Dx, the semiconductor layer CH may have a width Wc along the direction Dy, and the direction Dx is substantially perpendicular to the direction Dy. The top gate TG is located on the insulating layer 131, a length Lt of the top gate TG in the direction Dy and a length Lb of the bottom gate BG in the direction Dy are both larger than the width Wc of the semiconductor layer CH, and the length Lb of the bottom gate BG is greater than the length Lt of the top gate TG. Therefore, the top gate TG may extend along the direction Dy to span both sides of the semiconductor layer CH, and the top gate TG may also extend downward to the bottom gate BG along the two side walls of the insulating layers 121 and 131, so that the top gate TG is physically connected to the bottom gate BG to form an annular gate GE, and the top gate TG and the bottom gate BG surround the semiconductor layer CH. In this way, the gate GE may help preventing hydrogen ions in the reactive gases from entering the semiconductor layer CH during a formation process of the photoelectric conversion layer PN, so that the sensing device 20 has good reliability. In addition, the annular gate GE may also improve the carrier mobility of the semiconductor layer CH, for example, the carrier mobility of the semiconductor layer CH may be increased by 2 times. In this way, the sensing device 20 may provide a higher frame rate, for example, provide a high-frequency dynamic sensing image higher than 7 Hz.

In some embodiments, in the direction Dy, a spacing S4 between the side wall of the bottom gate BG and the side wall of the top gate TG may be 0 to 3 μm, for example, about 1 μm or about 2 μm. In some embodiments, a central axis of the annular gate GE may be located in the semiconductor layer CH.

In some embodiments, the top gate TG and the bottom gate BG have a width Wg in the direction Dx, and the width Wg may be 2 μm to 10 μm, such as 4 μm, 6 μm or 8 μm. In some embodiments, the minimum spacing S5 between the orthogonal projection of the top gate TG on the substrate 110 and the orthogonal projection of the source electrode SE on the substrate 110 may be 0 to 5 μm, which is preferably 1 μm to 3 μm, such as about 1.5 μm, 2 μm or 2.5 μm.

In summary, the fabricating method of the sensing device of the disclosure forms the common electrode and the source electrode with the same film layer, and forms the lower electrode and the top gate with the same film layer, so that the fabricating processes of the switching element and the sensing element may be integrated, and the sensing device has the structure integrating the switching element and the sensing element, and the number of process masks may be reduced and the process steps are simplified. Moreover, the fabricating method of the sensing device of the disclosure utilizes the blanket-covering conductor layer to block hydrogen ions, which may effectively prevent the hydrogen ions from entering the semiconductor layer, so as to avoid affecting the reliability of the sensing device. In addition, the sensing device of the disclosure has reduced parasitic capacitance of the scan line and the data line, so that ESD problem may also be mitigated. In addition, the sensing device of the disclosure also utilizes the annular gate to prevent hydrogen ions from entering the semiconductor layer, so that the sensing device may have good reliability.

It will be apparent to those skilled in the art that various modifications and variations can be made to the disclosed embodiments without departing from the scope or spirit of the disclosure. In view of the foregoing, it is intended that the disclosure covers modifications and variations provided they fall within the scope of the following claims and their equivalents.

What is claimed is:

1. A sensing device, comprising:

a substrate;

a switching element, disposed on the substrate, and comprising a bottom gate electrode, a top gate electrode, a drain electrode, a source electrode, a semiconductor layer located between the bottom gate electrode and the top gate electrode, a first island-shaped gate insulating layer disposed between the bottom gate electrode and the semiconductor layer, and a second island-shaped gate insulating layer disposed between the top gate electrode and the semiconductor layer, wherein the source electrode and the drain electrode are arranged along a first direction, wherein each of the first island-shaped gate insulating layer and the second island-shaped gate insulating layer has a first side surface and a second side surface opposite to the first side surface, and the first side surface and the second side surface are arranged along a second direction perpendicular to the first direction, wherein the top gate electrode has two parts extend downward along a normal direction of the substrate to respectively cover the first side surfaces and the second side surfaces so that two end portions of the top gate electrode respectively physically contact two end portions of the bottom gate electrode to form an annular gate completely surrounding the semiconductor layer, wherein the two end portions of the top gate electrode are arranged along the second direction, and the two end portions of the bottom gate electrode are arranged along the second direction;

a sensing element, disposed at one side of the switching element, and comprising:

a lower electrode, electrically connected to the source electrode;

a photoelectric conversion layer, disposed on the lower electrode; and an upper electrode, disposed on the photoelectric conversion layer;

a top insulating layer disposed on the sensing element and the top gate electrode of the switching element, having a first through hole, a second through hole, a third through hole and a fourth through hole, wherein the drain electrode is electrically connected to a drain region of the semiconductor layer through the first through hole, the source electrode is electrically connected to a source region of the semiconductor layer through the second through hole, and the lower electrode is electrically connected to the source electrode through the third through hole; and a common electrode extending along the second direction, electrically connected to the upper electrode and belonging to a same film layer as the source electrode, wherein the upper electrode is electrically connected to the common electrode through the fourth through hole of the top insulating layer, wherein a spacing between the lower electrode and the substrate is less than a spacing between the semiconductor layer and the substrate, with the proviso that the lower electrode is in contact with the photoelectric conversion layer.

2. The sensing device as claimed in claim 1, wherein the top gate electrode and the lower electrode belong to a same film layer.

3. The sensing device as claimed in claim 1, further comprising a data line, and the data line and the source electrode belonging to a same film layer.

4. The sensing device as claimed in claim 3, further comprising a scan line, wherein a spacing between the scan line and the data line is 3,000-12,000 Å in a direction normal to the substrate.

5. The sensing device as claimed in claim 1, wherein the photoelectric conversion layer completely overlaps the lower electrode, and the upper electrode completely overlaps the photoelectric conversion layer.

6. The sensing device as claimed in claim 1, wherein an orthographic projection of the lower electrode on the substrate is outside an orthographic projection of the semiconductor layer on the substrate.

7. The sensing device as claimed in claim 1, wherein the source electrode electrically connects the semiconductor layer with the lower electrode, and a portion of the source electrode between the semiconductor layer and the lower electrode has a step profile in a cross-sectional view cut through the semiconductor layer and the lower electrode.

8. The sensing device as claimed in claim 1, wherein a central axis of the annular gate is located in the semiconductor layer.

9. The sensing device as claimed in claim 1, wherein the drain electrode is disposed at a side of the annular gate opposite the source electrode.

* * * * *